United States Patent
Peart

(10) Patent No.: US 8,612,913 B1
(45) Date of Patent: Dec. 17, 2013

(54) AUTOMATED APPROACH TO PLANNING CRITICAL SIGNALS AND BUSSES

(71) Applicant: David Peart, Round Rock, TX (US)

(72) Inventor: David Peart, Round Rock, TX (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/725,725

(22) Filed: Dec. 21, 2012

(51) Int. Cl.
*G06F 9/455* (2006.01)
*G06F 17/50* (2006.01)

(52) U.S. Cl.
USPC ........... 716/113; 716/108; 716/111; 716/112; 716/126; 716/130; 703/19

(58) Field of Classification Search
USPC ................. 716/106–108, 110–113, 118–123, 716/126–131; 703/19
See application file for complete search history.

(56) References Cited

U.S. PATENT DOCUMENTS

| | | | |
|---|---|---|---|
| 5,910,899 A * | 6/1999 | Barrientos | 716/118 |
| 7,516,434 B2 * | 4/2009 | Okabe | 716/119 |
| 7,681,158 B2 * | 3/2010 | Uchino et al. | 716/113 |
| 7,831,950 B2 * | 11/2010 | Kashiwakura | 716/137 |
| 8,108,818 B2 * | 1/2012 | Sze et al. | 716/110 |
| 8,255,196 B2 * | 8/2012 | Walker et al. | 703/13 |
| 8,370,783 B2 * | 2/2013 | Uchino et al. | 716/131 |
| 8,386,978 B1 * | 2/2013 | Song et al. | 716/113 |
| 8,397,197 B1 * | 3/2013 | Chatterjee et al. | 716/118 |
| 2003/0074638 A1 * | 4/2003 | Osaka et al. | 716/1 |
| 2003/0212980 A1 * | 11/2003 | Frank et al. | 716/18 |
| 2004/0268285 A1 * | 12/2004 | Jenkins et al. | 716/13 |
| 2009/0007041 A1 * | 1/2009 | Miyagawa | 716/6 |
| 2009/0064068 A1 * | 3/2009 | Ng et al. | 716/6 |
| 2011/0225561 A1 * | 9/2011 | Orita et al. | 716/131 |
| 2011/0252391 A1 * | 10/2011 | Arimoto | 716/113 |
| 2013/0055187 A1 * | 2/2013 | Hiromitsu | 716/122 |

* cited by examiner

*Primary Examiner* — Nha Nguyen
(74) *Attorney, Agent, or Firm* — Blakely, Sokoloff, Taylor & Zafman LLP; Judith A. Szepesi

(57) ABSTRACT

A method and apparatus for determining the propagation delay of a selected net in a circuit design is described. In one exemplary embodiment, a selected net is received, where the selected net includes a plurality of characteristics that represent the physical and/or parasitic parameters of the net. A net is a set of one or more wires that connects a set of circuit junctions between a pair of endpoints of that net. In addition, a simulation is performed on the selected net using the plurality of characteristics. The circuit design system computes the propagation delay for the selected net based on the simulation and makes available the propagation delay of that net. The propagation delay for a net is the delay for a signal traveling between the endpoints of the net.

15 Claims, 6 Drawing Sheets

AUTOMATED APPROACH TO PLANNING CRITICAL SIGNALS AND BUSSES

FIELD

The disclosed embodiments relate to circuit design, and more particularly to the planning critical signals and busses of a circuit design.

BACKGROUND

Creating a quality floor plan is critical for chip timing closure. Propagation delays of signals through timing paths can be dominated by the delays introduced by interconnect wiring. As line widths of new technology nodes continue to shrink, resistive characteristics of interconnect increasingly dominate signal path propagation delays, or timing. Similarly, relative distances required to connect logic are effectively increasing. Currently, the largest chips that can be efficiently manufactured are about 3 mm per side. Keeping chip size constant while reducing line widths effectively increases interconnect wire lengths. In addition, the architecture of system on a chip (SoC) designs is dominated by Intellectual Property (IP) functions that are connected using busses. The number of wires in a bus can be huge—1024 bits is not uncommon in today's designs.

Designers manually calculate propagation delay for these critical nets by using a ruler to measure distances then calculating effective resistance (e.g., wires/layer, vias required) and running trial place and route experiments to determine quality of results (QoR) of a floorplan. Manual estimations of the propagation delay may take days, with trial placement and route runs that can take weeks.

SUMMARY

A method and apparatus for determining the propagation delay of a selected net in a circuit design is described. In one exemplary embodiment, a description of selected net is received, where the description of the selected net includes a plurality of characteristics that represent the physical and/or parasitic parameters of the net. A net is a set of one or more wires that connects a set of circuit junctions between a pair of endpoints of that net. In one embodiment, a simulation is performed on the selected nets using the plurality of characteristics. The circuit design system computes the propagation delay for the selected nets based on the simulation and makes available the propagation delay of those nets. The propagation delay for a net is the delay for a signal traveling between the endpoints of the net.

BRIEF DESCRIPTION OF THE DRAWINGS

The disclosed embodiments are illustrated by way of example and not limitation in the figures of the accompanying drawings in which like references indicate similar elements.

DETAILED DESCRIPTION

Figure 1:
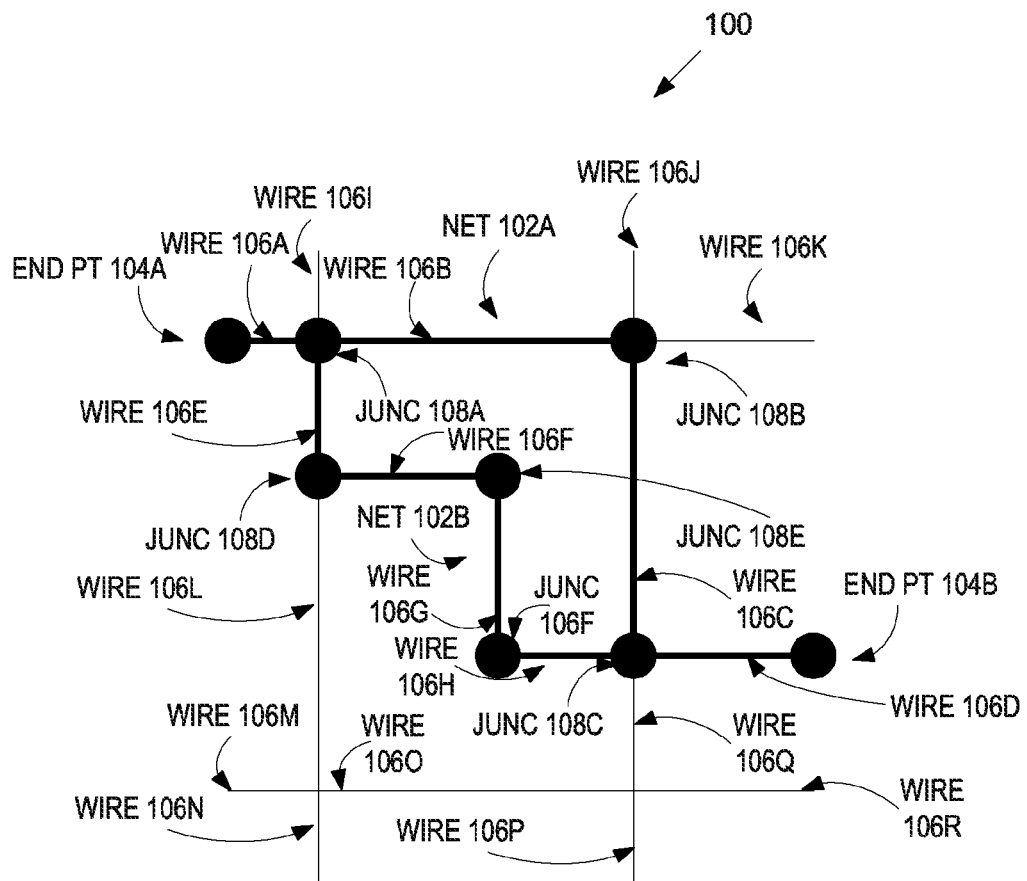
FIG. 1 illustrates a circuit diagram of one embodiment of nets in a circuit design.

Embodiments of the present invention disclose improved methods and apparatuses for performing propagation delay determinations of selected net(s) of a circuit design. In one embodiment, a user interface receives an indication of which nets will have a propagation delay determination. For each of the nets, the user interface sends the net information to a timing ruler module that calculates the propagation delay per unit length. The timing ruler module determines this propagation delay per unit length by having the net simulated as a test circuit. The timing ruler further calculates the propagation delay for that net by multiplying the determined propagation delay per unit length of that net times the length of that net.

In the design planning stage of chip implementation, creating a quality floor plan is critical for chip timing closure. Having the ability to easily and quickly determine the time of flight for key signals and busses will enable the designer to create a floor plan that is timing closable. In addition, a timing closable design will also allow the designer to converge on an implementable solution faster. Using the timing ruler to measure time instead of distance, the designer can easily identify critical timing paths. Once the paths have been identified the designer can make adjustments to the floorplan, thus improving QoR and reducing the number of iterations needed for design closure time to results (TTR).

As described above, a circuit designer is interested in the propagation delay of a signal in the different nets of a circuit. In one embodiment, a propagation delay for a net is the time that it takes for the signal to travel from one endpoint of a net to the other endpoint. In this embodiment, a net is a set of one or more wires that connects a set of circuit junctions between a pair of endpoints of that net. Various factors can affect the propagation delay of a signal in a net. For example, the length, width, and material type of the wires in net can affect the propagation delay. Generally, a shorter wire decreases the propagation delay, while a longer wire increases the propagation delay. Generally, a thicker wire decreases the propagation delay, while a thinner wire increases the propagation delay by increasing effective resistance. Furthermore, different types of wire material can increase or decrease the propagation delay. In addition, other factors can affect the propagation delay, such as wire spacing, wire layer, wire shielding requirements, vias, and adjusting the characteristics of the net to use non-default rules (NDR). For example and in one embodiment, circuit design technologies have default rules. The default rules can include buffers, buffer spacing, metal topology, and minimum requirements for wire spacing and width. A non-default rule is a rule that is created by the designer that alters any one of these default settings. For example, if the designer wanted to speed up a signal, the designer can create a non-default rule that says that a net will use a wire that is twice the minimum width. This non-default rule will speed up the net.

FIG. 1 illustrates a circuit diagram of one embodiment nets 102A-B in a circuit design 100. In one embodiment, the circuit design 100 includes nets 102A-B, end points 104A-B, wires 106A-R, and junctions 106A-E. Nets 102A-B are nets that are a set of one or more wires that connect a set of circuit junctions between a pair of endpoints of that net. In addition, each of the nets 102A-B is a net between endpoints 104A-B.

In this embodiment, net 102A includes wires 106A-D, junctions 108A-C, and end points 104A-B. As per above, the wires 106A-D can be of different length, width, and material type, and junctions 106A-B can be various types of vias or direct connections. In one embodiment, if the two wire segments are of the same metal type, the junction is the overlapping area between the two segments. If the two wire segments differ in metal type, the junction will be vias used to connect the two different segments. In this embodiment, the vias come in different shapes, sizes, and configurations. The vias are defined by the net routing rule, either taking for as the default rule, or being modified by a non-default rule.

Figure 2:
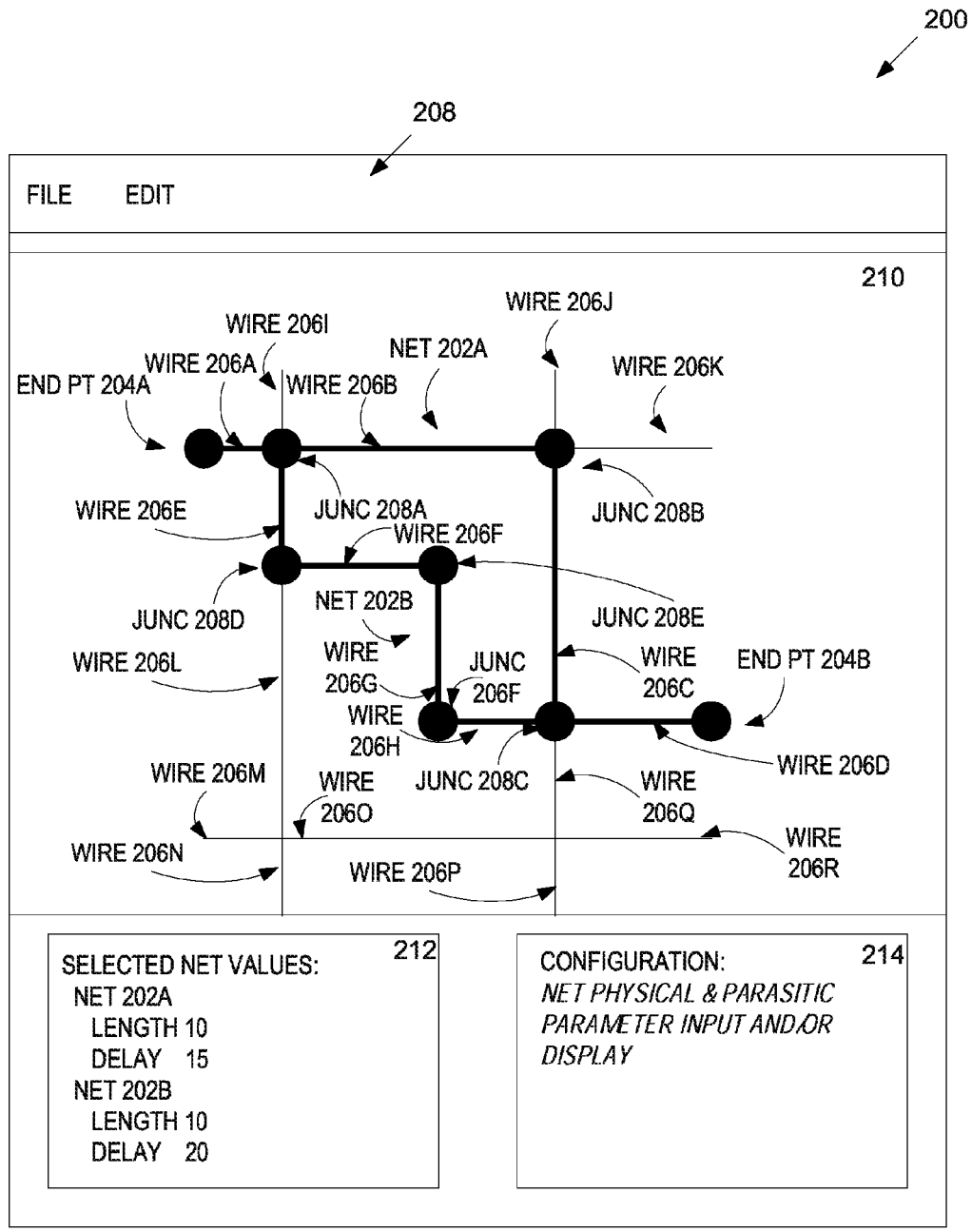
FIG. 2 illustrates an exemplary user interface for displaying multiple nets between two endpoints.

In one embodiment, the endpoints 104A-B are the beginning and ending of the net. In addition, net 102B includes wires 106A, E-H, and D, junctions 108A, D-F, and C, and endpoints 104A-B. As illustrated in FIG. 2, net 102A includes a smaller number of wires and junctions than net 102B with the same length between endpoints 104A-B (e.g., net 102A has four wires 106A-D and three junctions 108A-C and net 102B has six wires 106A, E-H, and D, and five junctions 108A, D-F, and C). However, based on the characteristics of the net wires and junctions, net 102A could have the same, longer, or shorter propagation delay than net 102B. For example, if wires for net 102B were wider than the wires for net 102A, the propagation delay for net 102B may be shorter than for net 102A. Because a designer would like to know the propagation delay of the net 102A-B between endpoints of the nets (e.g., endpoints 104A-B of nets 102A-B), it is useful to have tool to determine the propagation delay using the physical topologies defined for the signals of that net. This allows the designer to "measure" the time it takes for a signal to propagate from point A to point B. Removing the manual aspects of this task makes the chip designers more efficient.

In one embodiment, a circuit design tool includes a timing ruler that is used to determine the propagation delay for one or more selected nets. In this embodiment, the designer selects one or more nets of interest and invokes the timing ruler to calculate the propagation delay for these selected nets. In one embodiment, the propagation delay rules used by the timing ruler are configurable by the designer. This allows the designer to specify non-default rules (NDR), for example, the buffers, buffer spacing, and metal topology, of the timing ruler for the selected net(s). As a result, the tool can quickly perform the timing calculation and provide the estimated propagation delay to the designer via the timing ruler.

In one embodiment, the timing ruler determines the delay per unit length by having the selected net(s) simulated as a test circuit. In this embodiment, the timing ruler provides the physical and/or parasitic parameters to a circuit simulator. In this embodiment, the circuit simulator creates a test circuit from the parameters and returns a propagation delay per unit length of that test circuit. In one embodiment, the physical and/or parasitic parameters are parameters that describe the physical and environmental characteristics of the net. For example and in one embodiment, physical parameters are wire width, wire spacing, metal layer, voltage used for this net, wire spacing, percent neighborhood, etc. In one embodiment, the parasitic parameters are parasitic capacitance, resistance, inductance, etc. The result of this simulation is a calculated propagation delay per unit length for a net. The timing ruler, in one embodiment, has a scale in delay units (e.g. picoseconds), where the propagation delay for a net is determined by multiplying the calculated delay per unit length with the length of the net.

In one embodiment, this relatively quick method of estimating propagation delay would allow the designer to more fully explore the solution space for the design. In addition, the timing ruler also allows the designer to more easily make floorplan changes and accommodate critical timing signals. For example and in one embodiment, changes may include the relative placement of the blocks, pins, or applying non-default routing rules to a subset of critical nets. Without the timing ruler, issues may be revealed later in the design process when the cost associated with change is higher. For example, if a block has already been completed through layout and a change is needed at the top to address timing issues, the cost to rebuild the block in question is greater than creating the block correctly the first time. The timing ruler would allow the designer to create higher quality floor plans, leading to less design churn.

In one embodiment, the timing rule displays the length and propagation signal delay for each of the selected net(s). By displaying both the length and delay, a designer can use both to determine effectiveness of the selected net(s) design. An analogy to the timing ruler is map software that computes distances between two points, e.g., points A and B. Map software may display multiple paths between the two points, along with the distance and travel time for each of the multiple paths using a selected mode of transportation. Each of these multiple paths may have different distance and travel time, where the travel time is dependent on various factors (e.g., road capacity, amount of traffic, intersection signals, mode of transportation, etc.). For example, a short distance path may take longer travel time than a longer distance path because of the factors affecting each path. By displaying the time and distance, the map software user can use both in deciding which path to use. The map software displaying distance and travel time is analogous to the timing ruler displaying length and propagation signal delay for each of the selected net(s). By displaying both the length and delay, a designer can use both to determine effectiveness of the selected net(s) design.

FIG. 2 illustrates an exemplary user interface 200 for displaying selected nets 202A-B between two endpoints with propagation delays for these selected nets. The user interface 200 includes a menu bar 208, net display area 210, net values display area 212, and configuration interface 214. In one embodiment, the menu bar is an area that includes the menu items for the user interface 200. In one embodiment, the net display area is an area that is used to display the nets of the circuit design.

In this example, as illustrated in net display area 210, there are two nets that are selected and displayed. For example, net display area 210 includes representations of nets 202A-B, end points 204A-B, wires 206A-R, and junctions 206A-E. As per above, nets 202A-B are nets that are a set of one or more wires that connect a set of circuit junctions between a pair of endpoints of that net. In addition, each of the nets 202A-B is a net between endpoints 204A-B. Although FIG. 2 illustrates two nets 202A-B with the same endpoints, user interface 200 may display one or more nets with the same, more, or fewer number of wires and/or junctions than illustrated in the example of FIG. 2. In addition, the nets displayed in the user interface 200 may display the nets having the same or different endpoints.

In this embodiment, net 202A includes wires 206A-D, junctions 208A-C, and end points 204A-B. As per above, the wires 206A-D can be of different lengths, width, and material type, and junctions 206A-B can be various types of vias or direct connections.

In one embodiment, the endpoints 204A-B are the beginning and ending of the net. In addition, net 202B includes wires 206A, E-H, and D, junctions 208A, D-F, and C, and endpoints 204A-B. As illustrated in FIG. 2, net 202A includes a smaller number of wires and junctions than net 202B with the same length between endpoints 204A-B (e.g., net 202A has four wires 206A-D and three junctions 208A-C and net 202B has six wires 206A, E-H, and D, and five junctions 208A, D-F, and C). However, based on the characteristics of the net wires and junctions, net 202A could have the same, greater, or shorter propagation delay than net 202B. For example, if wires for net 202B were wider than the wires for net 202A, the propagation delay for net 202B may be smaller than for net 202A.

In one embodiment, to determine the propagation delay, a designer would select the net of interest and indicate that the propagation delay is to be determined. While in one embodiment, the circuit designer starts the propagation delay determination by selecting a menu item, in alternate embodiments, the circuit starts the propagation delay determination in another way (button, mouse, click, spoken command, command line interface, etc.).

In response to the indication, timing ruler calculates the propagation delay, and the user interface 200 displays the propagation delay for the selected net. In one embodiment, the propagation delay for the selected net is displayed in the net values display area 212. In this embodiment, the propagation delay is displayed for the selected net along with other characteristics of the selected (e.g., net length, etc.). In another embodiment, the propagation delay for that net is displayed alongside the selected net, in a pop-up window, in a log, in a separate report, written to storage, in another format, and/or a combination thereof.

As mentioned above, the designer can configure the parameters that are used by the timing ruler. In one embodiment, these parameters are invoked by the system to determine a propagation delay. For example and in one embodiment, the buffer, buffer spacing, metal topology, etc., are characteristics of the selected net(s) that are used by the timing ruler and which can be input in the configuration interface 214. In this embodiment, the configuration interface 214 is an interface that displays the current physical and/or parasitic parameters of the selected net and allows the designer to edit, delete, and/or add to these parameters. For example and in one embodiment, these physical and/or parasitic can be manually input by the designer, retrieved from a database, populated from defaults of the circuit design, and/or a combination thereof.

In addition to the nets 202A-B displayed in user interface 200, in one embodiment additional wires maybe displayed as well. In one embodiment, these additional wires 206I-R represent the wire(s) in the neighborhood of the nets 202A-B of interest. For example in FIG. 2 shows wires 206I-R displayed in user interface 200.

As described above, the user interface 200 allows a designer to determine the propagation delay of one or more selected nets. By having the user interface 200, the designer can get relatively quick feedback on the performance of the relevant and/or critical net(s) and further allows the designer to make floorplan changes and accommodate critical timing signals and rapidly evaluate the results of such changes.

Figure 3:
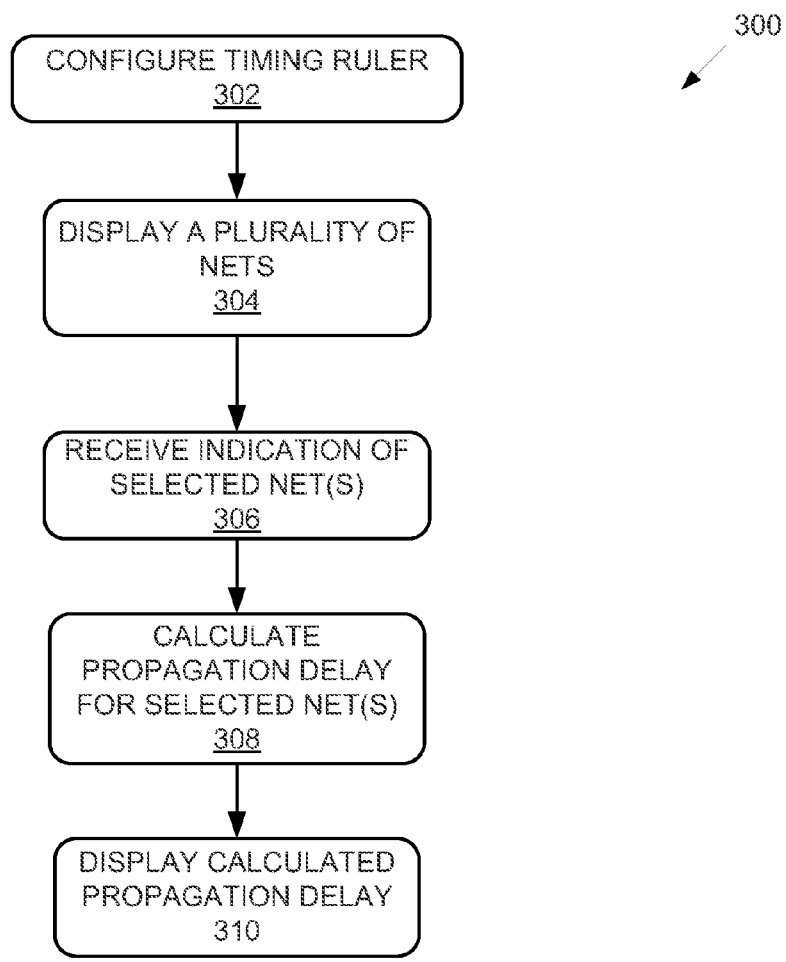
FIG. 3 illustrates a process flow diagram for one embodiment of determining and displaying a propagation delay for a selected net.

FIG. 3 illustrates a process 300 flow diagram of one embodiment for calculating and displaying a propagation delay for a selected net. Process 300 begins by configuring the timing ruler at block 302. In one embodiment, process 300 receives the configuration information from a designer via a user interface, such as user interface 200 as described in FIG. 2 above. In one embodiment, the timing ruler may be configured automatically for a default set of rules. In one embodiment, the designer may adjust the some or all of the default rules to be non-default rules.

At block 304, process 300 displays a plurality of nets. In one embodiment, the plurality of nets is the nets that are part of the circuit design being evaluated by the designer. In one embodiment, the plurality of nets displayed includes some or all of the nets that are part of the circuit being designed. By displaying the plurality of nets, the designer is able to select one or more nets of interest in order to calculate the propagation delay for those selected nets.

Process 300 receives an indication of the selected net(s) for a propagation delay calculation at block 306. In one embodiment, with this indication, process 300 identifies the selected net(s). As described above, the selected net(s) can be single one of many available nets that process 300 identifies. Alternatively, process 300 can identify more than one net. In one embodiment, the selected net(s) can be one or more nets. In addition, the number of selected net(s) can be fewer than the number of nets in the plurality of nets. In one embodiment, the selected net(s) are used to determine a propagation delay for each of the selected net(s). In one embodiment, a designer selects the net(s) of interest by clicking on the net endpoints, net junctions, or other identifying portions of the net(s). In one embodiment, each of the selected net(s) includes a plurality of characteristics. In one embodiment, the plurality of characteristics includes physical and/or parasitic parameters for that net (e.g., wire width, wire spacing, metal layer, voltage used for this net, wire spacing, wire spacing percent, etc.).

At block 308, process 300 calculates the propagation delay of the selected net(s). In one embodiment, process 300 sends the plurality of net characteristics of the selected net(s) to a circuit simulator that calculates the propagation delay per unit length. For example and in one embodiment, the circuit simulator calculates the propagation delay per unit length by simulating a small test circuit using the plurality of net characteristics. In one embodiment, process 300 calculates the propagation delay for only one selected net. For example and in one embodiment, process 300 receives the indication for that one selected net, where the circuit design includes many other nets. In this embodiment, process 300 calculates the propagation delay for that one selected net without calculating propagation delays for the other possible nets in the circuit design. This example allows the designer to get relatively quick feedback on the performance of a critical net and further allows the designer to make floorplan changes and accommodate critical timing signals and rapidly evaluate the results of such changes.

In one embodiment, process 300 computes the propagation delay by multiplying the calculated delay per unit length times the length of the selected net. While there may be a different delay per unit length in the actual implementation of the net, the estimate based on the multiplication is sufficient for an evaluation of propagation delay. In one embodiment, the analysis per circuit segment may have a different propagation delay per unit length.

In one embodiment, the propagation delay calculation is accomplished by simulating the circuit based on input from the timing ruler, where the circuit simulation calculates a delay per unit length. This timing ruler has a scale in delay units (e.g. picoseconds), where the propagation delay for a net is determined by multiplying by the calculated delay per unit length. In this embodiment, process 300 receives the propagation delay for each of the selected net(s) from the circuit simulator. In another embodiment, process 300 computes the propagation delay without sending the information to a separate circuit simulator.

Process 300 displays the calculated propagation delay for each of the selected net(s) at block 310. In one embodiment, the propagation delay for the selected net is displayed in the net values display area 212 as described above in FIG. 2. In this embodiment, the propagation delay is displayed for the selected net along with other characteristics of the selected (e.g., net length, etc.). In another embodiment, the propagation delay for that net is displayed alongside the selected net, in a pop-up window, in a log, etc., written to storage, and/or a combination thereof. In another embodiment, the data may be provided in a report or separate application or document.

Figure 4:
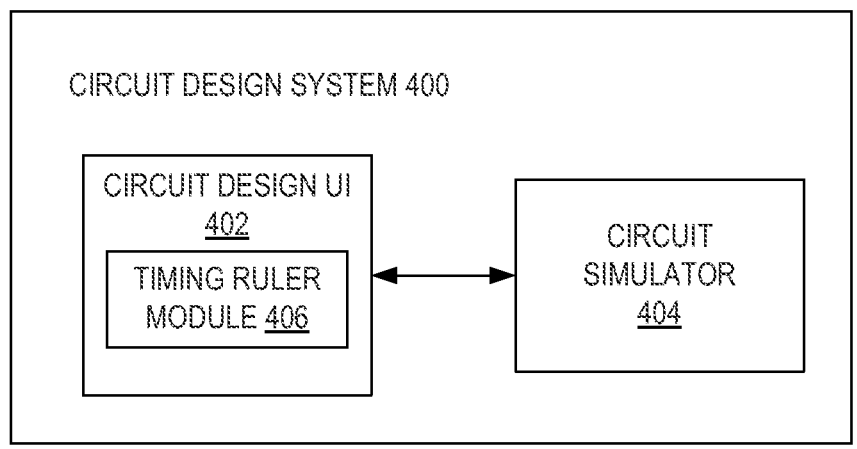
FIG. 4 illustrates a block diagram of one embodiment of a circuit design system to determine and display a propagation delay for a selected net.

In one embodiment, process 300 sends the net information to another module to calculate the propagation delay for each of the selected net(s). FIG. 4 illustrates a block diagram of a circuit design system 400 to calculate and display a propagation delay for selected net(s). In one embodiment, the circuit design system 400 includes a circuit design user interface 402 and the circuit simulator 404. In addition, the circuit design user interface 402 includes a timing ruler module 406. In one embodiment, the timing ruler module 406 determines and displays the propagation delay of the selected net(s) as described in FIG. 3 above.

Figure 5:
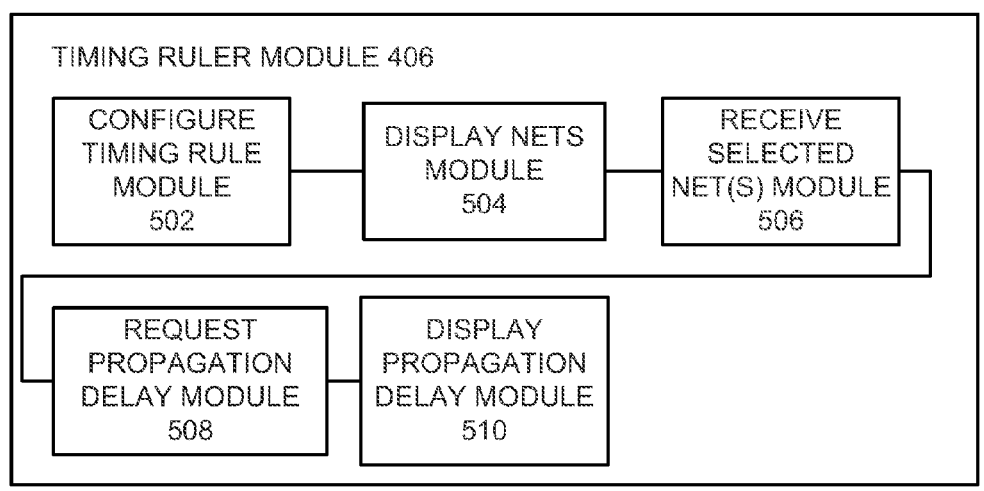
FIG. 5 illustrates a block diagram of one embodiment of a timing ruler to determine and display a propagation delay for a selected net.

FIG. 5 illustrates a block diagram of one embodiment of a timing ruler module 406 to determine and display a propagation delay for a selected net. In one embodiment, the timing ruler user interface module 406 includes configure timing ruler module 502, display nets module 504, receive selected net(s) module 506, request propagation delay module 508, and display propagation delay module 510. In one embodiment, the configure timing ruler module 502 configures the timing ruler as described in FIG. 3, block 302 above. In one embodiment, the display nets module 504 displays the nets as described in FIG. 3, block 304 above. In one embodiment, the receive selected net(s) module 506 receives the selected net(s) as described in FIG. 3, block 306 above. In one embodiment, the request propagation delay module 508 requests the propagation delay for each of the selected net(s) as described in FIG. 3, block 308 above. In one embodiment, the display propagation delay module 510 displays the propagation delay for each of the selected net(s) as described in FIG. 3, block 310 above.

In one embodiment, a circuit design tool that includes a timing ruler that is used to determine the propagation delay for one or more selected nets is described. In this embodiment, a designer selects one or more nets of interest and invokes the timing ruler to calculate the propagation delay for these selected nets. This allows the designer to specify non-default rules (NDR), for example, the buffers, buffer spacing, and metal topology, of the timing ruler for the selected net(s). As a result, the tool can quickly perform the timing calculation and provide the estimated propagation delay to the designer via the timing ruler. In this embodiment, this relatively quick method of estimating propagation delay would allow the designer to more fully explore the solution space for the design. In addition, the timing ruler also allows the designer to more easily make floorplan changes and accommodate critical timing signals. Thus, the timing ruler would allow the designer to create higher quality floor plans, leading to less design churn.

This description and drawings are illustrative of embodiments of the invention and are not to be construed as limiting the invention. Numerous specific details are described to provide a thorough understanding of the disclosed embodiments. However, in certain instances, well known or conventional details are not described in order to avoid obscuring the description of the disclosed embodiments. References to "an" or "one" embodiment in the present disclosure are not necessarily to the same embodiment; such references mean at least one embodiment.

Many of the methods of the disclosed embodiments may be performed with a digital processing system, such as a conventional, general-purpose computer system. Special purpose computers, which are designed or programmed to perform only one function, may also be used.

Figure 6:
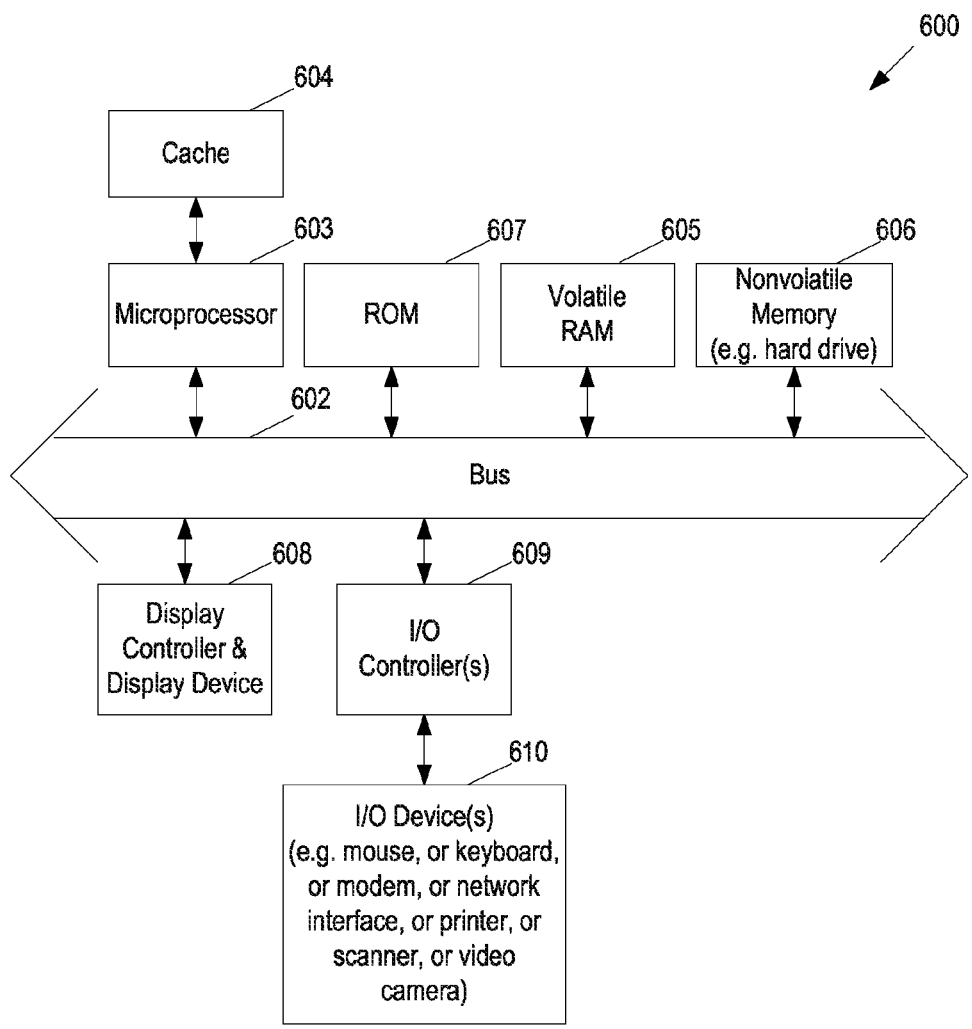
FIG. 6 illustrates a block diagram of an exemplary data processing system configured for use with the disclosed embodiments.

FIG. 6 shows one example of a typical computer system or data processing system that may be used with the disclosed embodiments. For example, in one embodiment the processes described with respect to FIG. 3 is operational through the example computing system. However, it is noted that while FIG. 6 illustrates various components of a computer system, it is not intended to represent any particular architecture or manner of interconnecting the components but rather provides an example representation of how the components and architecture may be configured. It will also be appreciated that network computers and other data processing systems that have fewer components or perhaps more components may also be used with the disclosed embodiments. The computer system of FIG. 6 may be any computing system capable of performing the described operations.

As shown in FIG. 6, the computer system 600, which is a form of a data processing system, includes a bus 602, which is coupled to one or more microprocessors 603. In one embodiment, computer system 600 includes one or more of a read only memory (ROM) 607, volatile memory (RAM) 605, and a non-volatile memory (EEPROM, Flash) 606. The microprocessor 603 is coupled to cache memory 604 as shown in the example of FIG. 6. Cache memory 604 may be volatile or non-volatile memory.

The bus 602 interconnects these various components together and in one embodiment interconnects these components 603, 607, 605, and 606 to a display controller and display device 608. The computer system 600 may further include peripheral devices such as input/output (I/O) devices, which may be mice, keyboards, modems, network interfaces, printers, scanners, video cameras and other devices which are well known in the art. Typically, the input/output devices 610 are coupled to the system through input/output controllers 609.

The volatile RAM 605 is typically implemented as dynamic RAM (DRAM) which requires power continually in order to refresh or maintain data in the memory. The non-volatile memory 606 is typically a magnetic hard drive, magnetic optical drive, an optical drive, a DVD RAM, a Flash memory, or other type of memory system which maintains data even after power is removed from the system. Typically, the non-volatile memory will also be a random access memory although this is not required.

While FIG. 6 shows that the non-volatile memory is a local device coupled directly to the rest of the components in the data processing system, it will be appreciated that the disclosed embodiments may utilize a non-volatile memory which is remote from the system, such as a network storage device which is coupled to the data processing system through a network interface such as a modem or Ethernet interface.

The bus 602 may include one or more buses connected to each other through various bridges, controllers and/or adapters as is well known in the art. In one embodiment the I/O controller 609 includes a USB (Universal Serial Bus) adapter for controlling USB peripherals, and/or an IEEE-1394 bus adapter for controlling IEEE-1394 peripherals.

It will be apparent from this description that aspects of the disclosed embodiments may be embodied, at least in part, in software (or computer-readable instructions). That is, the techniques, for example the processes of FIGS. 1 and 4 may be carried out in a computer system or other data processing system in response to its processor, such as a microprocessor, executing sequences of instructions contained in a memory, such as ROM 607, volatile RAM 605, non-volatile memory 606, cache 604 or a remote storage device. In various embodiments, hardwired circuitry may be used in combination with software instructions to implement the disclosed embodiments. Thus, the techniques are not limited to any specific combination of hardware circuitry and software nor to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor, such as the microprocessor 603.

A machine readable storage medium can be used to store software and data which when executed by a data processing system causes the system to perform various methods of the disclosed embodiments. This executable software and data may be stored in various places including for example ROM 607, volatile RAM 605, non-volatile memory 606 and/or cache 604 as shown in FIG. 6. Portions of this software and/or data may be stored in any one of these storage devices.

Thus, a machine readable storage medium includes any mechanism that stores any information in a form accessible by a machine (e.g., a computer, network device, personal digital assistant, manufacturing tool, any device with a set of one or more processors, etc.). For example, a machine readable medium includes recordable/non-recordable media (e.g., read only memory (ROM); random access memory (RAM); magnetic disk storage media; optical storage media; flash memory devices; etc.).

The detailed description of embodiments of the invention makes reference to the accompanying drawings in which like references indicate similar elements, showing by way of illustration specific embodiments of practicing the invention. Description of these embodiments is in sufficient detail to enable those skilled in the art to practice the invention. One skilled in the art understands that other embodiments may be utilized and that logical, mechanical, electrical, functional and other changes may be made without departing from the scope of the present invention. The detailed description is, therefore, not to be taken in a limiting sense, and the scope of the present invention is defined by the appended claims.

References within the specification to "one embodiment" or "an embodiment" are intended to indicate that a particular feature, structure, or characteristic described in connection with the embodiment is included in at least one embodiment of the present invention. The appearance of the phrase "in one embodiment" in various places within the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Some portions of the detailed description were presented as procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is conceived to be a self-consistent sequence of steps or instructions leading to a desired result. The steps are those requiring physical manipulations of physical quantities. Usually, though not necessarily, these quantities take the form of electrical or magnetic signals of a computer readable storage medium and are capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "sending" or "receiving" or "displaying" or "calculating" or "determining" or "multiplying" or "computing" or "identifying" or the like, refer to the action and processes of a computer system, or similar electronic computing device that manipulates and transforms data represented as physical (electronic) quantities within the computer system's registers and memories and other computer readable media into other data similarly represented as physical quantities within the computer system memories or registers or other such information storage, transmission or display devices.

In the foregoing specification, the disclosed embodiments have been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method, performed by a computing device, to determine a propagation delay of a selected net of a plurality of nets in a circuit design, the method comprising:
   identifying the selected net, the selected net includes a plurality of characteristics corresponding to the selected net;
   performing a first simulation of the selected net using the plurality of characteristics to estimate a propagation delay per unit length, wherein the performing of the first simulation includes,
      creating a test circuit using the plurality of characteristics of the selected net, and
      simulating the test circuit to estimate the propagation delay per unit length for the selected net without calculating propagation delays for other possible nets of the plurality of nets;
   computing the propagation delay for the selected net using a result of the first simulation; and
   providing for display of the propagation delay of the selected net in timing units, wherein a timing ruler displays the propagation delay of the selected net and enables a user to manipulate one or more of the plurality of characteristics of the selected net and to adjust the propagation delay of the selected net during circuit design.

2. The method of claim 1, wherein a net is a set of one or more wires that connects a set of circuit junctions between a pair of endpoints of that net.

3. The method of claim 1, further comprising:
   enabling a user to adjust a floorplan of the circuit design based on the propagation delay of the selected net.

4. The method of claim 1, wherein each of the plurality of characteristics is selected from the group consisting of wire width, wire spacing, metal layer, voltage, and wire spacing percent.

5. The method of claim 1, wherein the determining the propagation delay for the selected net comprises:
calculating the propagation delay for the selected net by multiplying the estimated propagation delay per unit length with a length of the selected net.

6. The method of claim 1, wherein the plurality of characteristics is received from one of user input, a database, and default values.

7. The method of claim 1, further comprising:
enabling a user to change one of the plurality of characteristics of the selected net,
performing a second simulation of the selected net using the changed characteristic, and
determining a new propagation delay for that selected net using a result of the second simulation.

8. The method of claim 1, wherein the simulating the test circuit is for only the selected net.

9. A non-transitory computer-readable storage medium storing instructions thereon, the instructions when executed by a processor causing the processor to perform a method to determine a propagation delay of a selected net of a plurality of nets in a circuit design, the method comprising:
identifying the selected net, the selected net includes a plurality of characteristics corresponding to the selected net;
performing a first simulation of the selected net using the plurality of characteristics to estimate a propagation delay per unit length, wherein the performing of the first simulation includes,
creating a test circuit using the plurality of characteristics of the selected net, and
simulating the test circuit to estimate the propagation delay per unit length for the selected net without calculating propagation delays for other possible nets of the plurality of nets;
computing the propagation delay for the selected net using a result of the first simulation; and
providing for display of the propagation delay of the selected net in timing units, wherein a timing ruler displays the propagation delay of the selected net and enables a user to manipulate one or more of the plurality of characteristics of the selected net and to adjust the propagation delay of the selected net during circuit design.

10. The non-transitory computer-readable storage medium of claim 9, wherein a net is a set of one or more wires that connects a set of circuit junctions between a pair of endpoints of that net.

11. The non-transitory computer-readable storage medium of claim 9, wherein the determining the propagation delay for the selected net comprises:
calculating the propagation delay for the selected net by multiplying the estimated propagation delay per unit length with a length of the selected net.

12. The non-transitory computer-readable storage medium of claim 9, wherein the method further comprises:
changing one of the plurality of characteristics of the selected net,
performing a second simulation of the selected net using the changed characteristic, and
determining new propagation delay for that selected net using a result of the second simulation.

13. The non-transitory computer-readable storage medium of claim 9, wherein the plurality of characteristics is received from one of user input, a database, and default values.

14. A circuit design system, comprising a processor to process instructions, to determine a propagation delay of a selected net of a plurality of nets in a circuit design, the circuit design system comprising:
a timing ruler that receives the selected net and computes the propagation delay for the selected net using a result of a simulation of the selected net, the selected net includes a plurality of characteristics corresponding to the selected net and
a circuit simulator module that performs the simulation using the plurality of characteristics of the selected net to estimate a propagation delay per unit length, wherein the circuit simulator,
creates a test circuit using the plurality of characteristics of the net, and
simulates the test circuit to estimate the propagation delay per unit length for the selected net without calculating propagation delays for other possible nets of the plurality of nets; and
a user interface that displays the propagation delay for the selected net and provides a representation of the selected net and enables a user to manipulate one or more of the plurality of characteristics of the selected net and to adjust the propagation delay during circuit design.

15. The circuit design system of claim 14, wherein a net is a set of one or more wires that connects a set of circuit junctions between a pair of endpoints of that net.

* * * * *